(12) United States Patent
Lin

(10) Patent No.: US 12,212,296 B2
(45) Date of Patent: Jan. 28, 2025

(54) POWER NOISE SUPPRESSION CIRCUIT AND MACHINE EQUIPMENT USING THE SAME

(71) Applicants: FON DA TECH CO., LTD., Hsinchu County (TW); SHENG-KAI CO., LTD., New Taipei (TW)

(72) Inventor: Chung-Liang Lin, New Taipei (TW)

(73) Assignees: FON DA TECH CO., LTD., Hsinchu County (TW); SHENG-KAI CO., LTD., New Taipei (TW)

( * ) Notice: Subject to any disclaimer, the term of this patent is extended or adjusted under 35 U.S.C. 154(b) by 321 days.

(21) Appl. No.: 17/879,980

(22) Filed: Aug. 3, 2022

(65) Prior Publication Data

US 2023/0039114 A1    Feb. 9, 2023

(30) Foreign Application Priority Data

Aug. 9, 2021   (TW) .................................. 110129308

(51) Int. Cl.
*H03H 11/12*    (2006.01)
(52) U.S. Cl.
CPC ................................ *H03H 11/126* (2013.01)
(58) Field of Classification Search
CPC . G05F 1/46; G05F 1/467; G05F 1/563; G05F 1/565; G05F 1/575; H02M 1/0009; H02M 1/0019; H02M 1/44; H02M 3/156; H02M 3/1566; H02M 3/33523; H02J 1/02; H03H 11/126

See application file for complete search history.

(56) References Cited

U.S. PATENT DOCUMENTS

| | | | |
|---|---|---|---|
| 9,755,519 B1* | 9/2017 | Huang | H03K 17/687 |
| 2014/0300330 A1* | 10/2014 | Sugiyama | H02M 3/156 |
| | | | 323/271 |
| 2022/0206519 A1* | 6/2022 | Zhong | G05F 1/461 |

* cited by examiner

*Primary Examiner* — Lincoln D Donovan
*Assistant Examiner* — Tyler J Pereny
(74) *Attorney, Agent, or Firm* — Locke Lord LLP; Tim Tingkang Xia, Esq.

(57) ABSTRACT

An embodiment of the present disclosure provides a power noise suppression circuit for machine equipment, which dynamically obtains a noise component in an input voltage provided by the power supply, generates a noise voltage accordingly, and compares the noise voltage with a feedback voltage to obtain a stable and low-noise power voltage, wherein the feedback voltage is generated by the power noise suppression circuit according to the power voltage. Therefore, the power noise suppression circuit of the embodiment of the present disclosure is particularly suitable for use in the machine equipment which is needed to be monitored and/or controlled precisely, such as a precision machining equipment or a semiconductor manufacturing equipment.

18 Claims, 3 Drawing Sheets

POWER NOISE SUPPRESSION CIRCUIT AND MACHINE EQUIPMENT USING THE SAME

BACKGROUND

Technical Field

The present disclosure relates to a power supply circuit, and particularly to, a power noise suppression circuit for a noise-sensitive machine equipment.

Related Art

The semiconductor industry is an important industry in worldwide, and in the supply chain of semiconductor products, the fab in Taiwan is an important key player. The semiconductor manufacturing equipment used in the semiconductor manufacturing process comprises at least a tool part, a driver and a sensor, wherein the sensor is used to detect the process environment, and the tool part is controlled by the operation of the driver for process processing, and the tool part is for example a plasma generation machine, a grinder, a conveying equipment or a robotic arm and so on, and the tool part is not limited to the above mentioned components. Both the driver and the sensor need to receive power, and the power usually determines the swing of the output signal. Therefore, when precise monitoring or control is required, it is usually desirable to provide a stable power.

Further, in addition to the semiconductor manufacturing equipment, other machining equipment (for example, the machining equipment which has a cutter to perform precision cutting) may also require a stable power supply, so that the precision parts manufactured do not have too much deviations. However, the power supply will be affected by environmental noise. The environmental heat, radio waves or other factors related to noise will determine the type and intensity of environmental noise. Simply put, it is impossible to directly assume that the environmental noise is white Gaussian noise and directly compensate it. Therefore, there is a need for the industry to provide a method that can dynamically reduce noise to provide a stable power.

SUMMARY OF THE RPESNENT DISCLOSURE

According to at least one objective of the present disclosure, an embodiment of the present disclosure provides a power noise suppression circuit comprising a noise extraction module, a comparison module, an output coupling module and a feedback module. The noise extraction module is configured to receive a first voltage and generate a noise voltage according to the first voltage. The comparison module is electrically connected to the noise extraction module, and has a first input end, a second input end and an output end. The first input end of the comparison module is configured to receive the noise voltage, the second input end of the comparison module is configured to receive a feedback voltage, and the comparison module compares the noise voltage and the feedback voltage to generate a comparison result signal. The output coupling module is electrically connected to the comparison module, and configured to receive the comparison result signal and the first voltage, thereby generating an second voltage as a power voltage according to the comparison result signal and the first voltage. The feedback module is electrically connected to the output coupling module, and configured to receive the second voltage and generate the feedback voltage.

According to the above features, the noise extraction module comprises a high-pass filter and a voltage-dividing circuit. The high-pass filter is configured to obtain a noise component of the first voltage and divide the noise component, and the voltage-dividing circuit divides the first voltage. An electrical connection point which the high-pass filter is electrically connected to the voltage-dividing circuit is configured to generate the noise voltage.

According to the above features, the voltage-dividing circuit comprises a first voltage-dividing resistor and a second voltage-dividing resistor, and the high-pass filter comprises a DC (direct current) isolation capacitor, a third voltage-dividing resistor and the second voltage-dividing resistor. One end of the DC isolation capacitor receives the first voltage, other one end of the DC isolation capacitor is electrically connected to one end of the third voltage-dividing resistor, one end of the first voltage-dividing resistor receives the first voltage, other one end of the DC isolation capacitor is electrically connected to one end of the second voltage-dividing resistor, other one end of the third voltage-dividing resistor is electrically connected to the end of the second voltage-dividing resistor, and other one end of the second voltage-dividing resistor is electrically connected to a ground voltage; wherein the noise voltage is generated on the other one end of the third voltage-dividing resistor.

According to the above features, the feedback module is a low-pass filter, an input end of the low-pass filter is configured to receive the second voltage, and the low-pass filter is configured to perform low-pass filtering on the second voltage, so that an output end of the low-pass filter generates the feedback voltage to the second input end of the comparison module which is electrically connected to the output end of the low-pass filter.

According to the above features, the low-pass filter comprises a first low-pass filtering resistor, a second low-pass filtering resistor, a third low-pass filtering resistor, a first low-pass filtering capacitor and a second low-pass filtering capacitor, wherein one end of the first low-pass filtering resistor receives the second voltage, other one end of the first low-pass filtering resistor is electrically connected one end of the first low-pass filtering capacitor, other one end of the first low-pass filtering capacitor is electrically connected to a ground voltage, one end of the second low-pass filtering resistor is electrically connected to the end of the first low-pass filtering capacitor, other one end of the second low-pass filtering resistor is electrically connected to one end of the second low-pass filtering capacitor, other one end of the second low-pass filtering capacitor is electrically connected to the ground voltage, one end of the third low-pass filtering resistor is electrically connected to the end of the second low-pass filtering capacitor, and other one end of the third low-pass filtering resistor is electrically connected to the second input end of the comparison module.

According to the above features, the comparison module comprises an operation amplifier, the first input end of the comparison module is an inverted input end of the operation amplifier, and the second input end of the comparison module is an non-inverted input end of the operation amplifier.

According to the above features, the feedback module comprises a voltage-compensation capacitor, one end of the voltage-compensation capacitor receives the second voltage, and other one end of the voltage-compensation capacitor is electrically connected to a compensation voltage adjustment end of the operation amplifier.

According to the above features, the output coupling module comprises a switch transistor, wherein a first end of the switch transistor receives the first voltage, a control end of the switch transistor receives the comparison result signal to control the switch transistor to be turned on or off, such that a second end of the switch transistor generates the second voltage accordingly.

According to the above features, the output coupling module further comprises an output resistor and a bias resistor, one end of the bias resistor receives the comparison result signal, other one end of the bias resistor is electrically connected to the control end of the switch transistor, one end of the output resistor is electrically connected to the second end of the switch transistor, and other one end of the output resistor is electrically connected to a ground voltage.

According to the above features, the switch transistor is a PNP BJT transistor.

According to the above features, the comparison module further comprises a noise filtering circuit, the noise filtering circuit receives the first voltage, filters a noise component of the first voltage to provide a third voltage to a positive power-on end of the operation amplifier, and an negative power-on end of the operation amplifier is electrically connected to a ground voltage.

According to the above features, the noise filtering circuit further comprises a noise filtering inductor, a noise filtering resistor and a noise filtering capacitor, one end of the noise filtering inductor receives the first voltage, other one end of the noise filtering inductor is electrically connected to the positive power-on end of the operation amplifier, one end of the noise filtering resistor is electrically connected to the other one end of the noise filtering inductor, other one end of the noise filtering resistor is electrically connected to a ground voltage, one end of the noise filtering capacitor is electrically connected to the other one end of the noise filtering inductor, and other one end of the noise filtering capacitor is electrically connected to the ground voltage.

According to the above features, the comparison module further comprises a light emission diode, an output end of the light emission diode is electrically connected to the ground voltage, and an input end of the light emission diode is electrically connected to the other one end of the noise filtering resistor.

According to at least objective of the present disclosure, an embodiment of the present disclosure provides a machine equipment comprising a power supply, the above power noise suppression circuit, a sensor, a driver, a tool part and a controller. The power supply is configured to provide a supply voltage. The power noise suppression circuit is electrically connected to the power supply, and configured to receive the supply voltage as a first voltage. The sensor is electrically connected to the power noise suppression circuit, and is configured to receive a power voltage provided by the power nose suppression circuit and generate a sensing signal. The driver is electrically connected to the power noise suppression circuit, and configured to receive the power voltage and a control signal to generate a driving signal. The tool part is electrically connected to the driver, and configured to be driven by the driving signal for machining. The controller is electrically connected to the power noise suppression circuit, the sensor and the driver, and configured to generate the control signal according to the sensing signal.

According to the above features, the machine equipment is a semiconductor manufacturing equipment or a machining equipment, and the tool part comprises at least one of a plasma generator, a grinder, a cutter, a conveying device and a robotic arm.

To sum up, compared with the prior art, the embodiment of the present disclosure provides a power noise suppression circuit for the noise-sensitive machine equipment, which dynamically monitors the noise component of the supply voltage, and controls the output power voltage accordingly, so as to ensure that the output power voltage has low noise and is stable.

BRIEF DESCRIPTION OF THE DRAWINGS

The present disclosure can be more fully understood by reading the subsequent detailed description and examples with references made to the accompanying drawings, wherein dimensions and arrangement configurations in the drawings are for illustration only, and the present disclosure is not limited thereto. Each figure of the drawings is briefly illustrated as follows.

DETAILS OF EXEMPLARY EMBODIMENTS

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

To solve the problems of the related art, an embodiment of the present disclosure provides a power noise suppression circuit used in a machine equipment, which dynamically acquires a noise component of an input voltage provided by a power supply, generates a noise voltage and compares the noise voltage with the feedback voltage to generate a stable power voltage with low noise. The feedback voltage is generated by power noise suppression circuit according to the power voltage. Thus, the power noise suppression circuit of the embodiment of the present disclosure is particularly suitable for use in the machine equipment which is needed to be monitored and/or controlled precisely, such as a precision machining equipment or a semiconductor manufacturing equipment.

Figure 1:
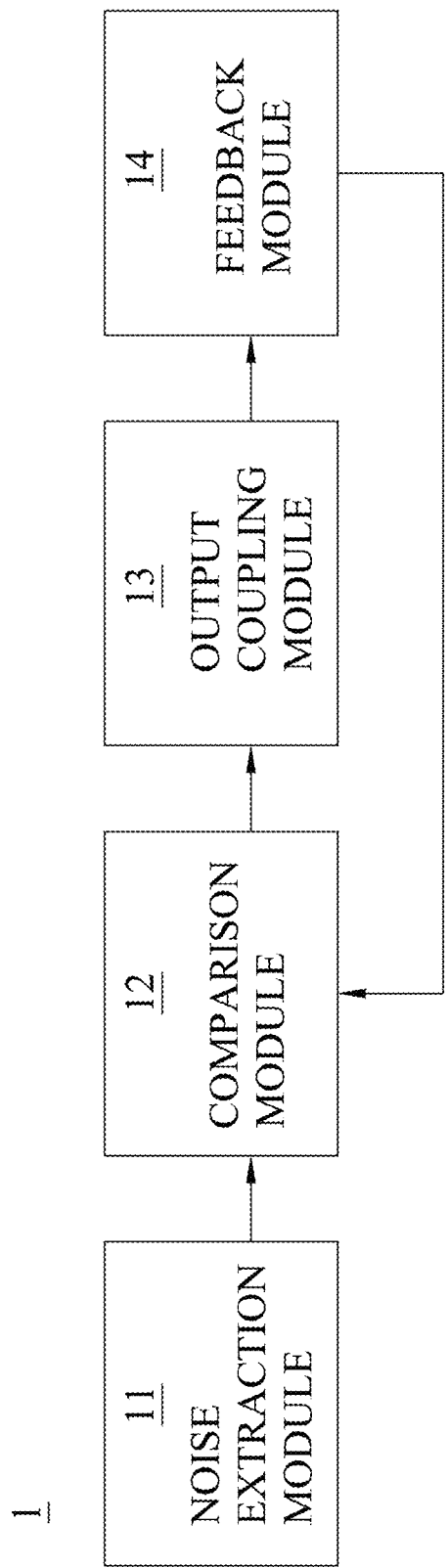
FIG. 1 is block diagram of a power noise suppression circuit provided by an embodiment of the present disclosure.
Figure 2:
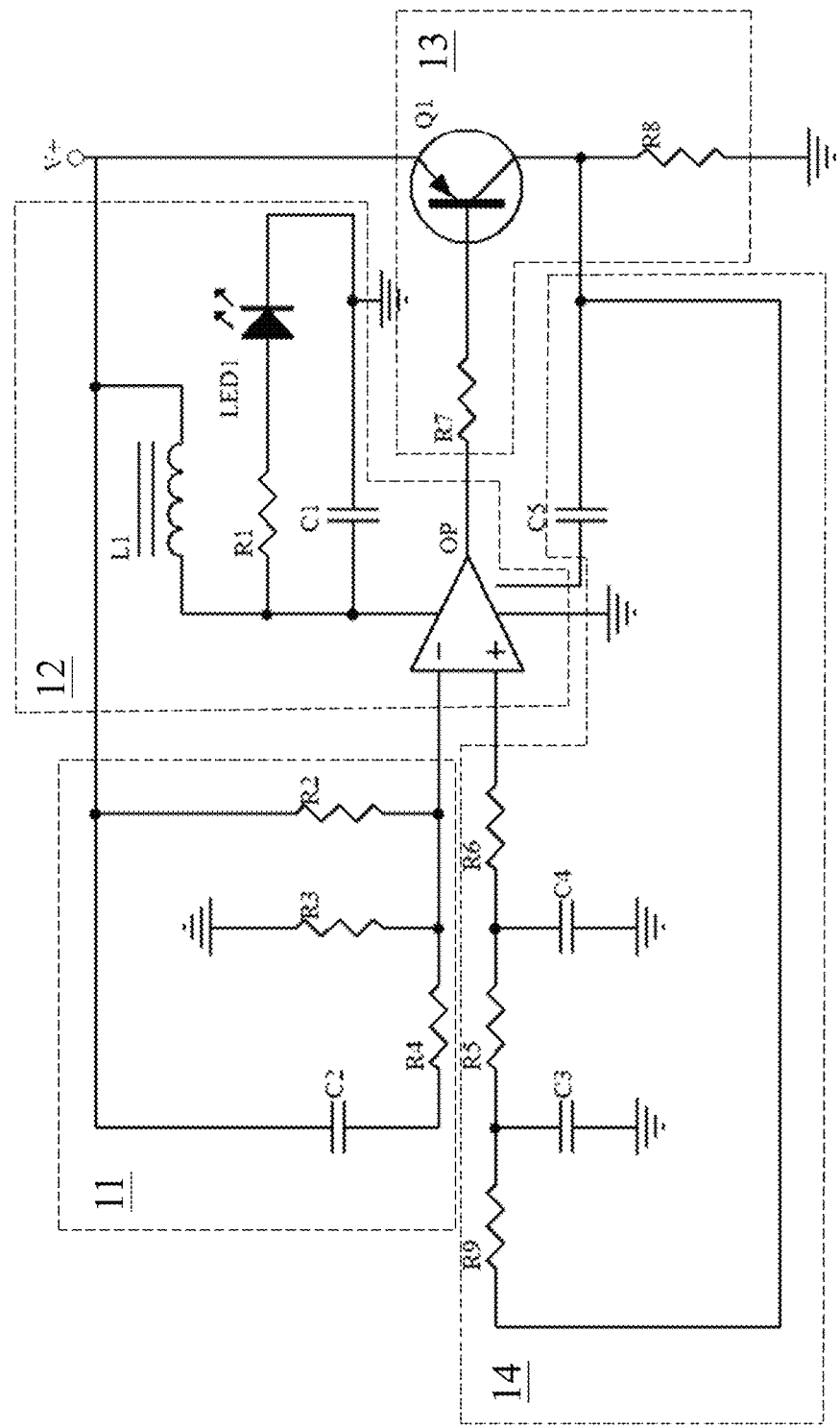
FIG. 2 is a circuit diagram of a power noise suppression circuit provided by an embodiment of the present disclosure.

Refer to FIG. 1 and FIG. 2 at the same time, FIG. 1 is block diagram of a power noise suppression circuit provided by an embodiment of the present disclosure, and FIG. 2 is a circuit diagram of a power noise suppression circuit provided by an embodiment of the present disclosure. The power noise suppression circuit 1 comprises a noise extraction module 11, a comparison module 12, an output coupling module 13 and a feedback module 14. The comparison module 12 is electrically connected to the noise extraction module 11, the output coupling module 13 and the feedback module 14. The output coupling module 13 the is electrically connected to the feedback module 14. The noise extraction module 11 is used to receive a first voltage V+, and generate a noise voltage according to the first voltage V+, wherein the first voltage V+ is a supply voltage provided by the power supply. The comparison module 12 has a first input end (i.e.

an inverted input end of the operation amplifier OP in the embodiment), a second input end (i.e. a non-inverted input end of the operation amplifier OP in the embodiment) and an output end (i.e. an output end of the operation amplifier OP in the embodiment). The first input end of the comparison module 12 is used to receive the noise voltage, the second input end of the comparison module 12 is used to receive the feedback voltage, and the comparison module 12 compares the received noise voltage with the feedback voltage to generate a comparison result signal. The output coupling module 13 is used for receiving the comparison result signal and the first voltage V+, so as to generate the second voltage as the power voltage according to the comparison result signal and the first voltage V+, wherein the power voltage can be used by the sensor or driver of the machine equipment (i.e. to supply the stable power with low noise to the sensor or driver of the machine equipment). The feedback module 14 is used to receive the second voltage and generate the feedback voltage.

The noise extraction module 11 comprises a DC isolation capacitor C2, a first voltage-dividing resistor R2, a second voltage-dividing resistor R3 and a third voltage-dividing resistor R4. One end of the DC isolation capacitor C2 receives the first voltage V+, and other one end of the DC isolation capacitor C2 is electrically connected to one end of the third voltage-dividing resistor R4. One end of the first voltage-dividing resistor R2 receives the first voltage V+, other one end of the DC isolation capacitor C2 is electrically connected to one end of the second voltage-dividing resistor R3, other one end of the third voltage-dividing resistor R4 is electrically connected to the end of the second voltage-dividing resistor R3, and other one end of the second voltage-dividing resistor R3 is electrically connected to a ground voltage.

By using the above structure, the noise component in the first voltage V+ can pass through the DC isolation capacitor C2 and be divided by the third voltage-dividing resistor R4 and the second voltage-dividing resistor R3. In addition, by using the first voltage-dividing resistor R2 and the second voltage-dividing resistor R3, a reference divided voltage to be used as a bias voltage is generated from the first voltage V+, and thus a noise voltage to be provided to the first input end of the comparison module 12 is generated on the other one end of the third voltage-dividing resistor R4.

Briefly, the first voltage-dividing resistor R2 and the second voltage-dividing resistor R3 form a voltage-dividing circuit, wherein the voltage-dividing circuit is used to divide the first voltage V+, in addition, the DC isolation capacitor C2, the third voltage-dividing resistor R4 and the second voltage-dividing resistor R3 form a high-pass filter. The high-pass filter is used to obtain the noise component of the first voltage V+ and divide the noise component. The voltage-dividing circuit divides the voltage of the first voltage V+, and the electrical connection point between the high-pass filter and the voltage-dividing circuit is used for generating the noise voltage. Of course, in other implementations, the implementations of the voltage-dividing circuit and the high-pass filter may be different from the above implementations, and the present disclosure is not limited to the implementations of the noise extraction module 11 in FIG. 2.

The comparison module 12 comprises an operation amplifier OP, the first input end of the comparison module 12 is an inverted input end of the operation amplifier OP, and the second input end of the comparison module 12 is a non-inverted input end of the operation amplifier OP.

The comparison module 12 can further optionally comprises a noise filtering inductor L1, a noise filtering resistor R1, a noise filtering capacitor C1 and a light emission diode LED1, wherein one end of the noise filtering inductor L1 receives the first voltage V+, other one end of the noise filtering inductor L1 is electrically connected to the positive power-on end of the operation amplifier OP, one end of the noise filtering resistor R1 is electrically connected to the other one end of the noise filtering inductor L1, other one end of the noise filtering resistor R1 is electrically connected to an input end of the light emission diode LED1, an output end of the light emission diode LED1 is electrically connected to the ground voltage, one end of the noise filtering capacitor C1 is electrically connected to the other one end of the noise filtering inductor L1, and other one end of the noise filtering capacitor C1 is electrically connected to the ground voltage.

The noise filtering inductor L1, the noise filtering resistor R1 and the noise filtering capacitor C1 form a noise filtering circuit. The noise filtering circuit receives the first voltage V+, and filters out the noise component of the first voltage V+ to provide the voltage to the positive power-on end of the operation amplifier OP, and the negative power-on end of the operation amplifier OP is electrically connected to the ground voltage. In addition, the light emission diode LED1 is used to indicate that the comparison module 12 has been powered on. The noise filtering circuit is used to make the third voltage received by the operation amplifier OP used as a comparator stable and have low noise. In addition, in the present disclosure, other types of noise filtering circuits may also be used, that is, the implementation manner of the above-mentioned noise filtering circuit is not intended to limit the present disclosure.

In another one embodiment of the present disclosure, the light emission diode LED1 can be removed, so that the other end of the noise filtering resistor R1 is directly electrically connected to the ground voltage. In addition, the noise filtering circuit may also have different implementations in the embodiments of the present disclosure, and the present disclosure is not limited thereto.

The output coupling module 13 comprises a switch transistor Q1, wherein a first end of the switch transistor Q1 receives the first voltage V+, and a control end of the switch transistor Q1 receives the comparison result signal, so as to control the switch transistor Q1 to be turned on or off, so that a second end of the switch transistor Q1 can generate the second voltage accordingly. In the embodiment of the present disclosure, the switch transistor Q1 is a PNP BJT transistor, but the present disclosure is not limited to this, and other types of transistors can also be used instead.

In addition, the output coupling module 13 further can optionally comprise an output resistor R8 and a bias resistor R7, wherein one end of the bias resistor R7 receives the comparison result signal, other one end of the bias resistor R7 is electrically connected to the control end of the switch transistor Q1, one end of the output resistor R8 is electrically connected to the second end of the switch transistor Q1, and other one end of the output resistor R8 is electrically connected to the ground voltage.

The feedback module 14 comprises a first low-pass filtering resistor R9, a second low-pass filtering resistor R5, a third low-pass filtering resistor R6, a first low-pass filtering capacitor C3 and a second low-pass filtering capacitor C4. One end of the first low-pass filtering resistor R9 receives the second voltage, other one end of the first low-pass filtering resistor R9 is electrically connected one end of the first low-pass filtering capacitor C3, other one end of the first low-pass filtering capacitor C3 is electrically connected to a ground voltage, one end of the second low-pass filtering resistor R5 is electrically connected to the end of the first low-pass filtering capacitor C3, other one end of the second low-pass filtering resistor R5 is electrically connected to one end of the second low-pass filtering capacitor C4, other one end of the second low-pass filtering capacitor C4 is electrically connected to the ground voltage, one end of the third low-pass filtering resistor R6 is electrically connected to the end of the second low-pass filtering capacitor C4, and other one end of the third low-pass filtering resistor R6 is electrically connected to the second input end of the comparison module 12.

The first low-pass filtering resistor R9, the second low-pass filtering resistor R5, the third low-pass filtering resistor R6, the first low-pass filtering capacitor C3 and the second low-pass filtering capacitor C4 form a low-pass filter. The input terminal of the low-pass filter receives the second voltage, and the low-pass filter is used to perform low-pass filtering on the second voltage, so as to generate the feedback voltage on the output end of the low-pass filter, and provide the feedback voltage to second input end of the comparison module 12 which is electrically connected to the output end of the low-pass filter. In addition, the implementation manner of the above-mentioned low-pass filter is not intended to limit the present disclosure, and other types of low-pass filters can also be used in the present disclosure.

In addition, the feedback module 14 can optionally further comprises a voltage-compensation capacitor C5, wherein one end of the voltage-compensation capacitor C5 receives the second voltage, and other one end of the voltage-compensation capacitor C5 is electrically connected to a compensation voltage adjustment end of the operation amplifier OP.

Figure 3:
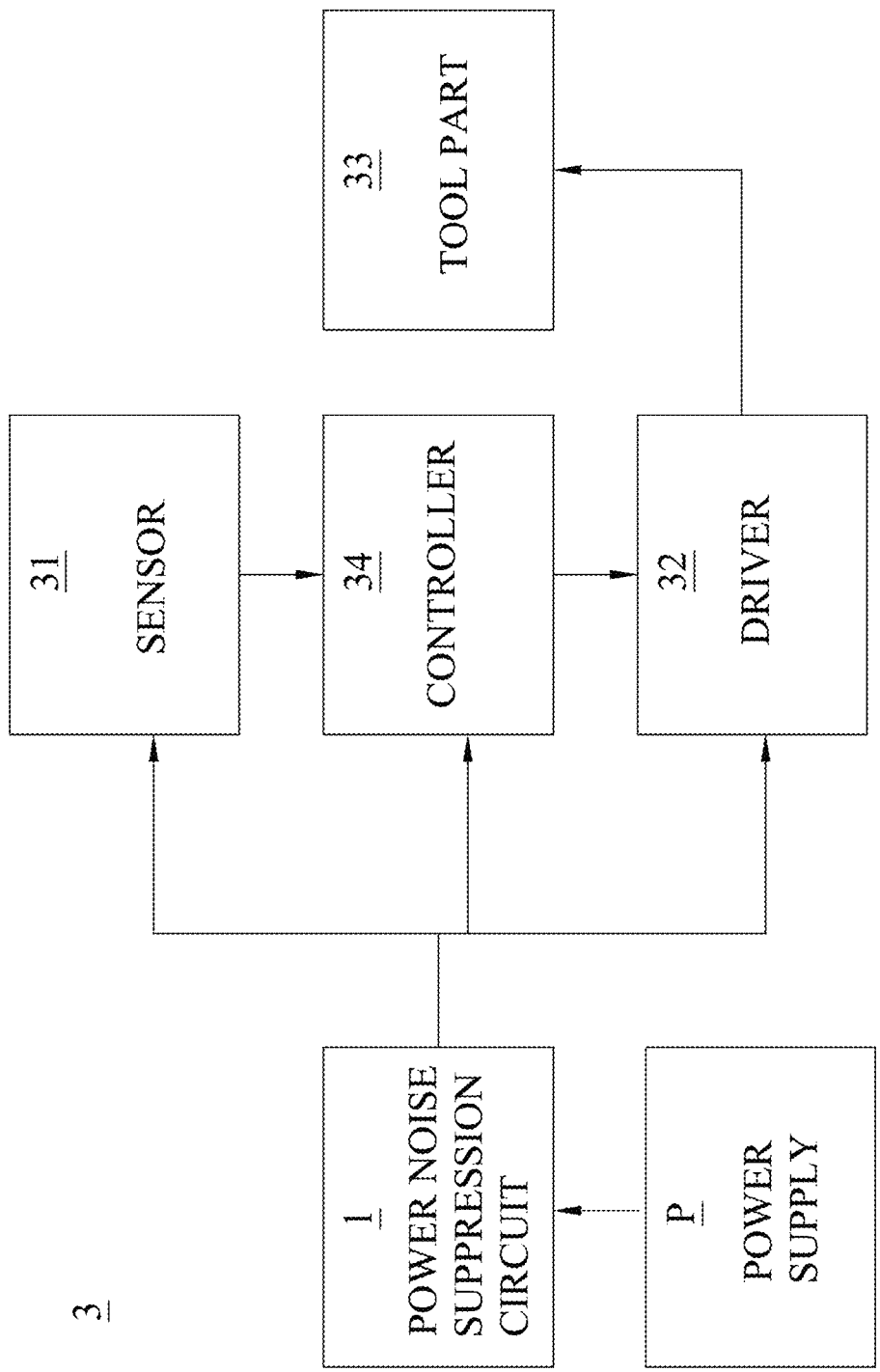
FIG. 3 is a schematic diagram of a semiconductor manufacturing equipment for manufacturing semiconductor finished products provided by an embodiment of the present disclosure.

Refer to FIG. 3, and FIG. 3 is a schematic diagram of a semiconductor manufacturing equipment for manufacturing semiconductor finished products provided by an embodiment of the present disclosure. The machine equipment 3 comprises a power supply P, the aforementioned power noise suppression circuit 1, a sensor 31, a driver 32, a tool part 33 and a controller 34. The power noise suppression circuit 1 is electrically connected to the power supply P, the sensor 31, the driver 32 and the controller 34, the tool part 33 is electrically connected to the driver 32, and the controller 34 is electrically connected to the sensor 31 and the driver 32. The power supply P provides a supply voltage, and the power noise suppression circuit 1 receives the supply voltage as the first voltage. The Sensor 31 receives the power voltage and is used to generate the sensing signal. The driver 32 receives the power voltage and is used to receive the control signal for the generation of a driving signal. The tool part 33 is electrically connected to the driver 32 and is driven by the driving signal for machining. The controller 34 is used to generate a control signal according to the sensing signal.

In the embodiment of the present disclosure, the machine equipment 3 can be, for example, a semiconductor manufacturing equipment or a machining equipment, and the tool part 33 can comprises at least one of a plasma generator, a grinder, a cutter, a conveying equipment, a pressure control equipment (for example, at least one of a vacuum machine or air valve controller), a developing device (such as a yellow light developing machine) and a robotic arm. In addition, the present disclosure does not limit the type of the machine equipment 3, and the machine equipment 3 in FIG. 3 is only one of the embodiments. The power noise suppression circuit 1 of the embodiment of the present disclosure can also be used in other machine equipment with different circuit structures.

To sum up, the power noise suppression circuit provided by the embodiment of the present disclosure dynamically monitors the noise component of the supply voltage, and controls the output power voltage accordingly. Thus, the power noise suppression circuit of the embodiment of the present disclosure is particularly suitable for use in the machine equipment which is needed to be monitored and/or controlled precisely, such as a precision machining equipment or a semiconductor manufacturing equipment.

While the present disclosure has been described by way of example and in terms of preferred embodiment, it is to be understood that the present disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power noise suppression circuit, comprising:
a noise extraction module, configured to receive a first voltage, and generate a noise voltage according to the first voltage;
a comparison module, electrically connected to the noise extraction module, having a first input end, a second input end and an output end, wherein the first input end of the comparison module is configured to receive the noise voltage, the second input end of the comparison module is configured to receive a feedback voltage, and the comparison module compares the noise voltage and the feedback voltage to generate a comparison result signal;
an output coupling module, electrically connected to the comparison module, configured to receive the comparison result signal and the first voltage, thereby generating an second voltage as a power voltage according to the comparison result signal and the first voltage; and
a feedback module, electrically connected to the output coupling module, configured to receive the second voltage and generate the feedback voltage;
wherein the noise extraction module comprises a high-pass filter and a voltage-dividing circuit, the high-pass filter is configured to obtain a noise component of the first voltage, and divide the noise component, the voltage-dividing circuit divides the first voltage, wherein an electrical connection point which the high-pass filter is electrically connected to the voltage-dividing circuit is configured to generate the noise voltage;
wherein the feedback module is a low-pass filter, an input end of the low-pass filter is configured to receive the second voltage, and the low-pass filter is configured to perform low-pass filtering on the second voltage, so that an output end of the low-pass filter generates the feedback voltage to the second input end of the comparison module which is electrically connected to the output end of the low-pass filter;
wherein the comparison module comprises an operation amplifier, the first input end of the comparison module is an inverted input end of the operation amplifier, and the second input end of the comparison module is an non-inverted input end of the operation amplifier;
wherein the comparison module further comprises a noise filtering circuit, the noise filtering circuit receives the first voltage, filters a noise component of the first voltage to provide a third voltage to a positive power-on end of the operation amplifier, and a negative power-on end of the operation amplifier is electrically connected to a ground voltage.

2. The power noise suppression circuit of claim 1, wherein voltage-dividing circuit comprises a first voltage-dividing resistor and a second voltage-dividing resistor, and the high-pass filter comprises a DC isolation capacitor, a third voltage-dividing resistor and the second voltage-dividing resistor; wherein one end of the DC isolation capacitor receives the first voltage, other one end of the DC isolation capacitor is electrically connected to one end of the third voltage-dividing resistor, one end of the first voltage-dividing resistor receives the first voltage, other one end of the DC isolation capacitor is electrically connected to one end of the second voltage-dividing resistor, other one end of the third voltage-dividing resistor is electrically connected to the end of the second voltage-dividing resistor, and other one end of the second voltage-dividing resistor is electrically connected to a ground voltage; wherein the noise voltage is generated on the other one end of the third voltage-dividing resistor.

3. The power noise suppression circuit of claim 1, wherein the low-pass filter comprises a first low-pass filtering resistor, a second low-pass filtering resistor, a third low-pass filtering resistor, a first low-pass filtering capacitor and a second low-pass filtering capacitor, wherein one end of the first low-pass filtering resistor receives the second voltage, other one end of the first low-pass filtering resistor is electrically connected one end of the first low-pass filtering capacitor, other one end of the first low-pass filtering capacitor is electrically connected to a ground voltage, one end of the second low-pass filtering resistor is electrically connected to the end of the first low-pass filtering capacitor, other one end of the second low-pass filtering resistor is electrically connected to one end of the second low-pass filtering capacitor, other one end of the second low-pass filtering capacitor is electrically connected to the ground voltage, one end of the third low-pass filtering resistor is electrically connected to the end of the second low-pass filtering capacitor, and other one end of the third low-pass filtering resistor is electrically connected to the second input end of the comparison module.

4. The power noise suppression circuit of claim 1, wherein the feedback module comprises a voltage-compensation capacitor, one end of the voltage-compensation capacitor receives the second voltage, and other one end of the voltage-compensation capacitor is electrically connected to a compensation voltage adjustment end of the operation amplifier.

5. The power noise suppression circuit of claim 1, wherein the output coupling module comprises a switch transistor, wherein a first end of the switch transistor receives the first voltage, a control end of the switch transistor receives the comparison result signal to control the switch transistor to be turned on or off, such that a second end of the switch transistor generates the second voltage accordingly.

6. The power noise suppression circuit of claim 5, wherein the output coupling module further comprises an output resistor and a bias resistor, one end of the bias resistor receives the comparison result signal, other one end of the bias resistor is electrically connected to the control end of the switch transistor, one end of the output resistor is electrically connected to the second end of the switch transistor, and other one end of the output resistor is electrically connected to a ground voltage.

7. The power noise suppression circuit of claim 6, wherein the switch transistor is a PNP BJT transistor.

8. The power noise suppression circuit of claim 1, wherein the noise filtering circuit further comprises a noise filtering inductor, a noise filtering resistor and a noise filtering capacitor, one end of the noise filtering inductor receives the first voltage, other one end of the noise filtering inductor is electrically connected to the positive power-on end of the operation amplifier, one end of the noise filtering resistor is electrically connected to the other one end of the noise filtering inductor, other one end of the noise filtering resistor is electrically connected to a ground voltage, one end of the noise filtering capacitor is electrically connected to the other one end of the noise filtering inductor, and other one end of the noise filtering capacitor is electrically connected to the ground voltage.

9. The power noise suppression circuit of claim 8, wherein the comparison module further comprises a light emission diode, an output end of the light emission diode is electrically connected to the ground voltage, and an input end of the light emission diode is electrically connected to the other one end of the noise filtering resistor.

10. A machine equipment, comprising:
a power supply, configured to provide a supply voltage;
a power noise suppression circuit, electrically connected to the power supply, configured to receive the supply voltage as a first voltage;
a sensor, electrically connected to the power noise suppression circuit, configured to receive a power voltage provided by the power nose suppression circuit and generate a sensing signal;
a driver, electrically connected to the power noise suppression circuit, configured to receive the power voltage and a control signal to generate a driving signal;
a tool part, electrically connected to the driver, configured to be driven by the driving signal for machining; and
a controller, electrically connected to the power noise suppression circuit, the sensor and the driver, configured to generate the control signal according to the sensing signal;
wherein the power noise suppression circuit comprises:
a noise extraction module, configured to receive the first voltage, and generate a noise voltage according to the first voltage;
a comparison module, electrically connected to the noise extraction module, having a first input end, a second input end and an output end, wherein the first input end of the comparison module is configured to receive the noise voltage, the second input end of the comparison module is configured to receive a feedback voltage, and the comparison module compares the noise voltage and the feedback voltage to generate a comparison result signal;
an output coupling module, electrically connected to the comparison module, configured to receive the comparison result signal and the first voltage, thereby generating an second voltage as the power voltage according to the comparison result signal and the first voltage; and
a feedback module, electrically connected to the output coupling module, configured to receive the second voltage and generate the feedback voltage;
wherein the noise extraction module comprises a high-pass filter and a voltage-dividing circuit, the high-pass filter is configured to obtain a noise component of the first voltage, and divide the noise component, the voltage-dividing circuit divides the first voltage, wherein an electrical connection point which the high-pass filter is electrically connected to the voltage-dividing circuit is configured to generate the noise voltage;

wherein the feedback module is a low-pass filter, an input end of the low-pass filter is configured to receive the second voltage, and the low-pass filter is configured to perform low-pass filtering on the second voltage, so that an output end of the low-pass filter generates the feedback voltage to the second input end of the comparison module which is electrically connected to the output end of the low-pass filter.

11. The machine equipment of claim 10, wherein the machine equipment is a semiconductor manufacturing equipment or a machining equipment, and the tool part comprises at least one of a plasma generator, a grinder, a cutter, a conveying device and a robotic arm.

12. The machine equipment of claim 10, wherein voltage-dividing circuit comprises a first voltage-dividing resistor and a second voltage-dividing resistor, and the high-pass filter comprises a DC isolation capacitor, a third voltage-dividing resistor and the second voltage-dividing resistor;

wherein one end of the DC isolation capacitor receives the first voltage, other one end of the DC isolation capacitor is electrically connected to one end of the third voltage-dividing resistor, one end of the first voltage-dividing resistor receives the first voltage, other one end of the DC isolation capacitor is electrically connected to one end of the second voltage-dividing resistor, other one end of the third voltage-dividing resistor is electrically connected to the end of the second voltage-dividing resistor, and other one end of the second voltage-dividing resistor is electrically connected to a ground voltage;

wherein the noise voltage is generated on the other one end of the third voltage-dividing resistor.

13. The machine equipment of claim 10, wherein the low-pass filter comprises a first low-pass filtering resistor, a second low-pass filtering resistor, a third low-pass filtering resistor, a first low-pass filtering capacitor and a second low-pass filtering capacitor, wherein one end of the first low-pass filtering resistor receives the second voltage, other one end of the first low-pass filtering resistor is electrically connected one end of the first low-pass filtering capacitor, other one end of the first low-pass filtering capacitor is electrically connected to a ground voltage, one end of the second low-pass filtering resistor is electrically connected to the end of the first low-pass filtering capacitor, other one end of the second low-pass filtering resistor is electrically connected to one end of the second low-pass filtering capacitor, other one end of the second low-pass filtering capacitor is electrically connected to the ground voltage, one end of the third low-pass filtering resistor is electrically connected to the end of the second low-pass filtering capacitor, and other one end of the third low-pass filtering resistor is electrically connected to the second input end of the comparison module.

14. The machine equipment of claim 10, wherein the comparison module comprises an operation amplifier, the first input end of the comparison module is an inverted input end of the operation amplifier, and the second input end of the comparison module is an non-inverted input end of the operation amplifier; wherein the feedback module comprises a voltage-compensation capacitor, one end of the voltage-compensation capacitor receives the second voltage, and other one end of the voltage-compensation capacitor is electrically connected to a compensation voltage adjustment end of the operation amplifier.

15. The machine equipment of claim 10, wherein the output coupling module comprises a switch transistor, wherein a first end of the switch transistor receives the first voltage, a control end of the switch transistor receives the comparison result signal to control the switch transistor to be turned on or off, such that a second end of the switch transistor generates the second voltage accordingly; wherein the output coupling module further comprises an output resistor and a bias resistor, one end of the bias resistor receives the comparison result signal, other one end of the bias resistor is electrically connected to the control end of the switch transistor, one end of the output resistor is electrically connected to the second end of the switch transistor, and other one end of the output resistor is electrically connected to a ground voltage; wherein the power noise suppression circuit of claim 6, wherein the switch transistor is a PNP BJT transistor.

16. The machine equipment of claim 14, wherein the comparison module further comprises a noise filtering circuit, the noise filtering circuit receives the first voltage, filters a noise component of the first voltage to provide a third voltage to a positive power-on end of the operation amplifier, and an negative power-on end of the operation amplifier is electrically connected to a ground voltage.

17. The machine equipment of claim 16, wherein the noise filtering circuit further comprises a noise filtering inductor, a noise filtering resistor and a noise filtering capacitor, one end of the noise filtering inductor receives the first voltage, other one end of the noise filtering inductor is electrically connected to the positive power-on end of the operation amplifier, one end of the noise filtering resistor is electrically connected to the other one end of the noise filtering inductor, other one end of the noise filtering resistor is electrically connected to a ground voltage, one end of the noise filtering capacitor is electrically connected to the other one end of the noise filtering inductor, and other one end of the noise filtering capacitor is electrically connected to the ground voltage.

18. The machine equipment of claim 17, wherein the comparison module further comprises a light emission diode, an output end of the light emission diode is electrically connected to the ground voltage, and an input end of the light emission diode is electrically connected to the other one end of the noise filtering resistor.

* * * * *